United States Patent
Leifso et al.

(10) Patent No.: US 6,847,239 B2
(45) Date of Patent: Jan. 25, 2005

(54) FREQUENCY DIVIDER SYSTEM

(75) Inventors: Curtis R. Leifso, Kanata (CA); Samuel A. Tiller, Ottawa (CA)

(73) Assignee: Research In Motion Limited, Waterloo (CA)

( * ) Notice: Subject to any disclaimer, the term of this patent is extended or adjusted under 35 U.S.C. 154(b) by 0 days.

(21) Appl. No.: 10/414,876

(22) Filed: Apr. 16, 2003

(65) Prior Publication Data

US 2003/0193355 A1 Oct. 16, 2003

Related U.S. Application Data (60) Provisional application No. 60/372,425, filed on Apr. 16, 2002.

(51) Int. Cl.[7] .............................................. H03K 21/00
(52) U.S. Cl. ........................ 327/117; 327/113; 327/115
(58) Field of Search ................................ 327/117, 115, 327/113, 114; 377/47, 115

(56) References Cited

U.S. PATENT DOCUMENTS

| | | | | |
|---|---|---|---|---|
| 3,873,815 A | * | 3/1975 | Summers ..................... | 708/103 |
| 3,896,387 A | * | 7/1975 | Kokado ........................ | 377/48 |
| 3,943,379 A | * | 3/1976 | McGuffin .................... | 377/115 |
| 4,366,394 A | * | 12/1982 | Clendening et al. .......... | 377/47 |

OTHER PUBLICATIONS

R. Magoon, et al., "RF Local Oscillator Path for GSM Direct Conversion Transceiver with True 50% Duty Cycle Divide by Three and Active Third Harmonic Cancellation," 2002 IEEE Radio Frequency Integrated Circuits Symposium, pp. 23–26.

* cited by examiner

*Primary Examiner*—Tuan T. Lam
*Assistant Examiner*—Hiep Nguyen
(74) *Attorney, Agent, or Firm*—Jones Day; Krishna K. Pathiyal; Robert Liang (57) ABSTRACT

A frequency divider circuit for providing a divided clock signal having a frequency that is an odd integer factor less than the frequency of an incoming system clock signal. The frequency divider includes a clock generator circuit coupled to a delay circuit which operates in an active and a reset phase to provide a divided clock signal from the system clock signal. In the active phase, the clock generator circuit drives the divided clock signal to a first logic state until a reset signal is received. The delay circuit then generates the reset signal at a predetermined number of system clock edges after the divided clock signal is driven to the first logic state. In the reset phase, both the clock generator circuit and the delay circuit are reset in response to the reset signal such that the clock generator circuit immediately drives the divided clock signal to a second logic state, and the delay circuit disables the reset signal within the predetermined number of system clock edges. The delay circuit maintains a 50% duty cycle for the divided clock signal.

13 Claims, 5 Drawing Sheets

FREQUENCY DIVIDER SYSTEM

CROSS-REFERENCE TO RELATED APPLICATIONS

The present application claims priority to U.S. Provisional Application No. 60/372,425 filed on Apr. 16, 2002, the contents of which are incorporated herein, by reference, in their entirety.

FIELD OF THE INVENTION

This invention relates generally to frequency division techniques for RF (Radio Frequency) signals. More particularly, the present invention relates to a circuit for converting a system clock signal to a clock signal having a reduced frequency.

BACKGROUND OF THE INVENTION

Most electronic devices require a clock signal to synchronize operations of its internal components with each other. This clock signal is commonly referred to as the system clock, and can be provided by a crystal oscillator having a fixed frequency. Telecommunication devices also require clock signals for transmission and reception of RF signals in addition to a system clock.

Advances in circuit design and semiconductor manufacturing techniques have increased the maximum operating frequency of high performance electronic devices. For example, current Intel Pentium class microprocessors can run at a system clock frequency between 1 GHz and 2 GHz.

Unfortunately, some components of an electronic device will only operate at a maximum frequency that is well below the desired system clock frequency. Although different components will operate with different clock frequencies, all the components of the electronic device must operate synchronously with each other. It is not possible to include separate crystal oscillators in the electronic device because it is impractical to synchronize all the oscillators to the same system clock edges. Furthermore, the addition of more crystal oscillators increases the size of the electronic device, an undesirable attribute of portable devices. Hence on chip frequency divider circuits are used to convert the system clock signal to lower frequencies.

Generally, a frequency divider circuit removes a fixed number of cycles, or pulses, from the incoming system clock signal. For example, a divide-by-2 frequency divider that receives a 10 MHz signal will provide a 5 MHz output. Therefore different components of the electronic device can operate at different speeds, but all synchronized to the system clock and as a result, with each other. For wireless devices, the ability to convert the system clock signal to different frequencies enables its compatibility with regulatory requirements for different frequency bands and enables the device to do so in a cost effective manner, as well as enabling frequency translation of signals in systems with multiple intermediate (IF) frequencies, synchronized calibration, shared clocks between different circuits.

Wireless devices with tri-band transceivers, such as GSM frequency bands for example, require a local oscillator signal in the RF receiver down-conversion mixer and the RF transmitter up-conversion mixer in order to receive and/or send RF signals. A divide by three factor of the system clock signal enables the use of a single local oscillator to support for example, the three GSM frequency bands. Frequency dividers of the art can divide the incoming frequency by any even or odd factor, and typically consists of a chain of flip-flop circuits arranged in a ring such that its output is fed-back to its input. Traditional divide-by-3 or other odd numbered frequency dividers are not capable of producing a lowered frequency having a 50% duty cycle. A 50% duty cycle is highly desired in RF applications to reduce spurious outputs from the device as well as to reduce the sensitivity of the device to spurious inputs. Furthermore, a 50% duty cycle is desired because when driving mixers, the worst-case noise is seen when the mixer switches are both on (i.e. during the transition period). A 50% duty cycle minimizes the average noise and hence reduces the noise figure of the mixer.

Other frequency dividers require combinational logic between each flip-flop stage which is difficult to implement in RF applications due to the voltage headroom constraints and bandwidth limitations that can limit performance of the device. Other solutions are too complex and are thus not cost effective implement.

It is therefore desirable to provide a frequency divider circuit that provides a reduced clock frequency having a 50% duty cycle which does not require the use of combinational logic between flip-flop stages, is simple and cost effective to implement.

SUMMARY OF THE INVENTION

It is an object of the present invention to obviate or mitigate at least one disadvantage of previous frequency dividers, particularly those used in mobile devices.

In a first aspect, the present invention provides a frequency divider for reducing the frequency of a clock signal by an odd numbered factor n, where n is an integer value. The frequency divider comprises a clock generator circuit for receiving the clock signal and for providing an n-divided clock signal having a first and second logic level. The clock generator circuit drives the n-divided clock signal from the first logic level to the second logic level in response to a reset signal. A clock delay circuit activates the reset signal at n clock transitions after receiving the first logic level of the n-divided clock signal, and deactivates the reset signal within n clock transitions after receiving the second logic level of the divided clock signal. The clock generator circuit drives the n-divided clock signal from the second logic level to the first logic level at n clock transitions after activation of the reset signal.

In presently preferred embodiments, the clock generator circuit includes a first resettable flip-flop having a data input connected to a supply voltage and a reset input for receiving the reset signal, a second resettable flip-flop having a data input for receiving the divided clock signal and a reset input for receiving the reset signal, the second resettable flip-flop providing a delayed n-divided clock signal, and at least one pair of serially connected non-resettable flip-flops receiving the delayed n-divided clock signal from the second resettable flip-flop for activating and deactivating the reset signal.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached figures, wherein.

DETAILED DESCRIPTION

A frequency divider circuit for providing a divided clock signal having a frequency that is a factor less than the frequency of an incoming system clock signal is disclosed. The frequency divider includes a clock generator circuit coupled to a delay circuit that operates in an active and a reset phase to provide a divided clock signal from the system clock signal. In the active phase, the clock generator circuit drives the divided clock signal to a first logic state until a reset signal is received. The delay circuit then generates the reset signal at a number of system clock transitions after the divided clock signal is driven to the first logic state. In the reset phase, the first two flip flops are reset only, the delay formed by the second two flip-flops does not have any reset inputs, however, their inputs are reset to a logic '0' two clock cycles after the reset signal is asserted. The delay circuit therefore maintains a 50% duty cycle for the divided clock signal. More particularly, the frequency divider according to embodiments of the present invention provides a clock signal that is divided by three, or any other odd divisions such as divide by (2*n+1) where n>=0 while maintaining a 50% duty cycle for the divided clock signal.

Figure 1:
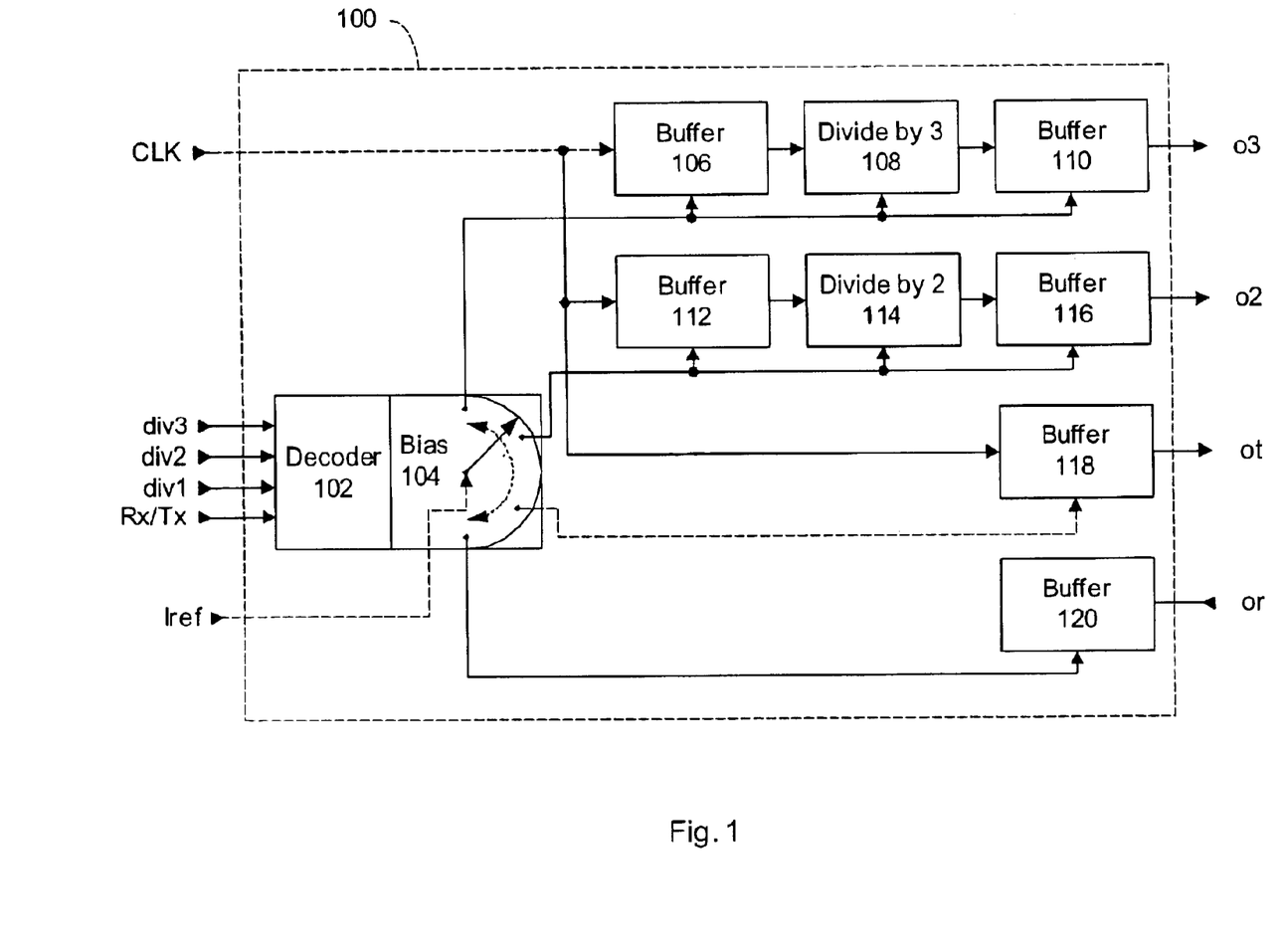
FIG. 1 shows a block diagram of an RF divider system according to an embodiment of the present invention.

FIG. 1 is a block diagram of an RF divider system suitable for portable wireless devices. The RF divider system 100 receives a system clock signal CLK and can selectively provide a divide-by-1, 2 or 3 clock signal. Additionally, RF divider system 100 conserves power by activating only the selected clock divider sub-circuit. RF divider system 100 includes a divide-by-3 sub-block, a divide-by-2 sub-block, a divide-by-1 sub-block, a decoder 102 and a bias circuit 104.

The divide-by-3 sub-block consists of a clock input buffer 106, a divide-by-3 circuit 108 and clock output buffer 110. The clock input buffer 106 receives the system clock CLK and provides a buffered CLK signal to the divide-by-3 circuit 108. The divide-by-3 circuit 108 generates a pre-buffered divided system clock signal having a frequency equal to the system clock frequency divided by 3. The pre-buffered divided system clock signal is buffered by clock output buffer 110 and appears on the o3 output terminal.

The divide-by-2 sub-block consists of a clock input buffer 112, a divide-by-2 circuit 114 and clock output buffer 116. The clock input buffer 112 receives the system clock CLK and provides a buffered CLK signal to the divide-by-2 circuit 114. The divide-by-2 circuit 114 generates a pre-buffered divided system clock signal having a frequency equal to the system clock frequency divided by 2. The pre-buffered divided system clock signal is buffered by clock output buffer 116 and appears on the o2 output terminal. For this particular embodiment, clock input buffers 106 and 112 are identical, as are clock output buffers 110 and 116.

The divide-by-1 sub-block consists of a clock input buffer 118 that provides a buffered CLK signal on the ot output terminal, and a clock input buffer 120 that receives an external clock signal from its or input terminal.

Decoder 102 receives selection signals div3, div2, div1 and Rx/Tx for controlling bias circuit 104. Bias circuit 104 receives a current signal Iref and performs a sub-block select function, and based on the logic states of the selection signals, drives Iref to power, or enable, one of the divide-by-3, divide-by-2 and divide-by-1 sub-blocks. In other words, bias circuit 104 selectively couples Iref to one of the aforementioned sub-blocks. This function is illustrated by the four individual lines extending from bias circuit 104 to their respective sub-blocks in FIG. 1. Accordingly, signals div3, div2, and div1 select the division function to enable, i.e. divide-by-3, divide-by-2 or divide-by-1, respectively. In the divide-1 case, the additional Rx/Tx signal is used to indicate which of ot and or, for transmitting and receiving respectively, should be enabled. For example, if div3 is at a high logic level and all other selection signals are at a low logic level, decoder 102 will control bias circuit 104 to selectively couple Iref to the divide-by-3 sub-block consisting of buffers 106 and 110, and divide-by-3 circuit 108.

Hence a system employing RF divider system 100 only requires a single oscillator to provide a fixed system clock to provide divided clock signals having one half or one third of the system clock frequency. Furthermore, the decoder 102 and bias circuit 104 help save power by keeping unused sub-blocks inactive. Such a design helps conserve battery power and extend the operation time of mobile devices.

Figure 3:
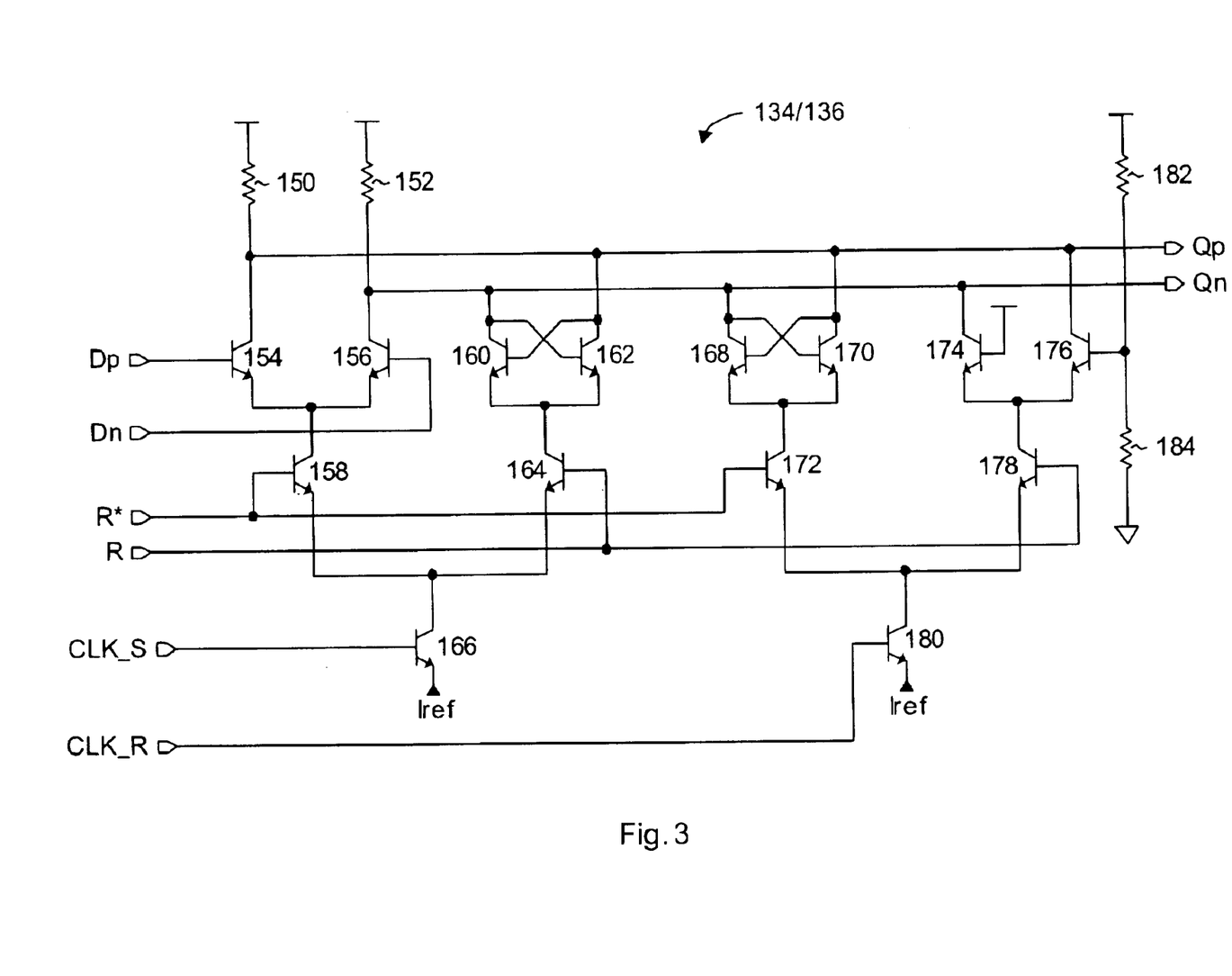
FIG. 3 shows a circuit diagram of the resettable flip-flop circuit of FIG. 2.
Figure 4:
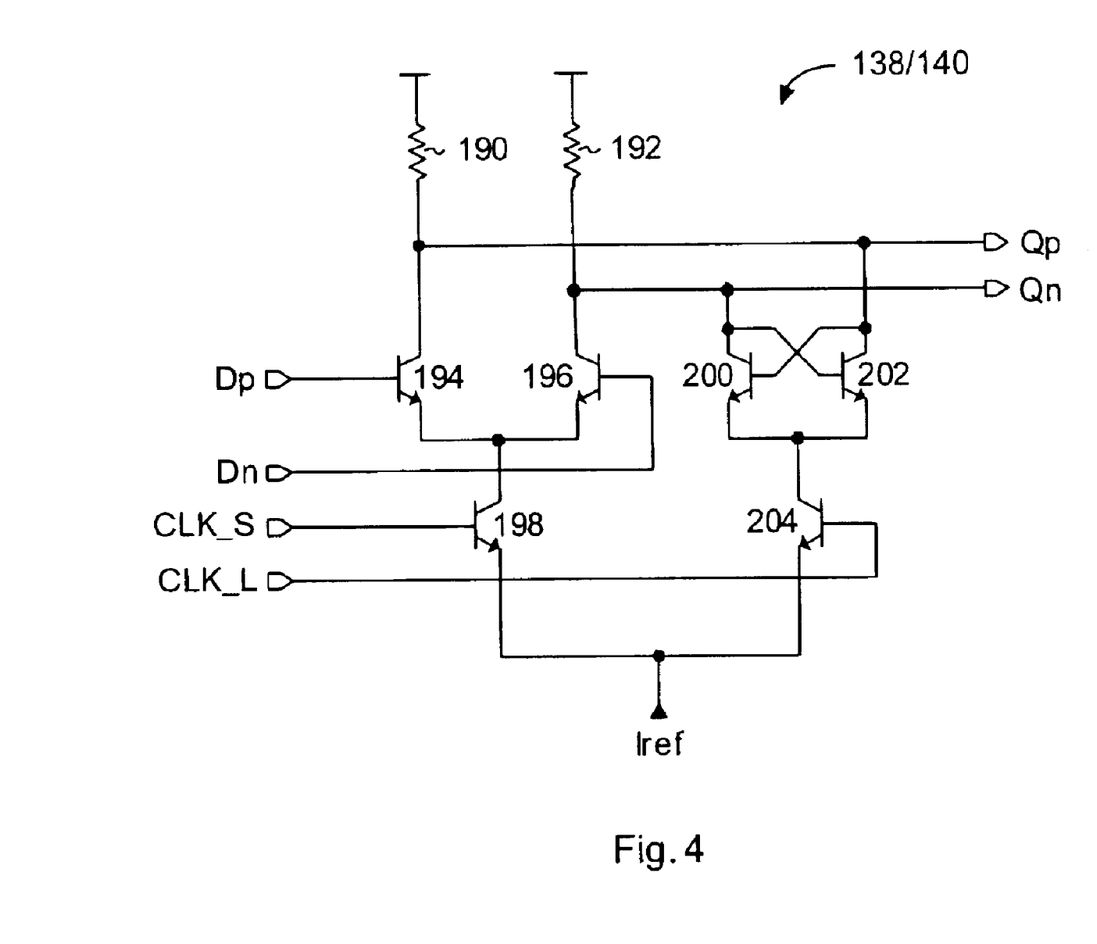
FIG. 4 shows a circuit diagram of the non-resettable flip-flop circuit of FIG. 2; and, FIG. 5 shows a sequence diagram illustrating the operation of the divide-by-3 circuit of FIG. 2.

The circuit implementations for clock input buffers 106 and 102, clock output buffers 110 and 116, decoder 102 and bias circuit 104 shown in FIG. 1 are well known in the art. Circuit details for the divide-by-3 circuit 108 are shown in FIGS. 2 to 4.

Figure 2:
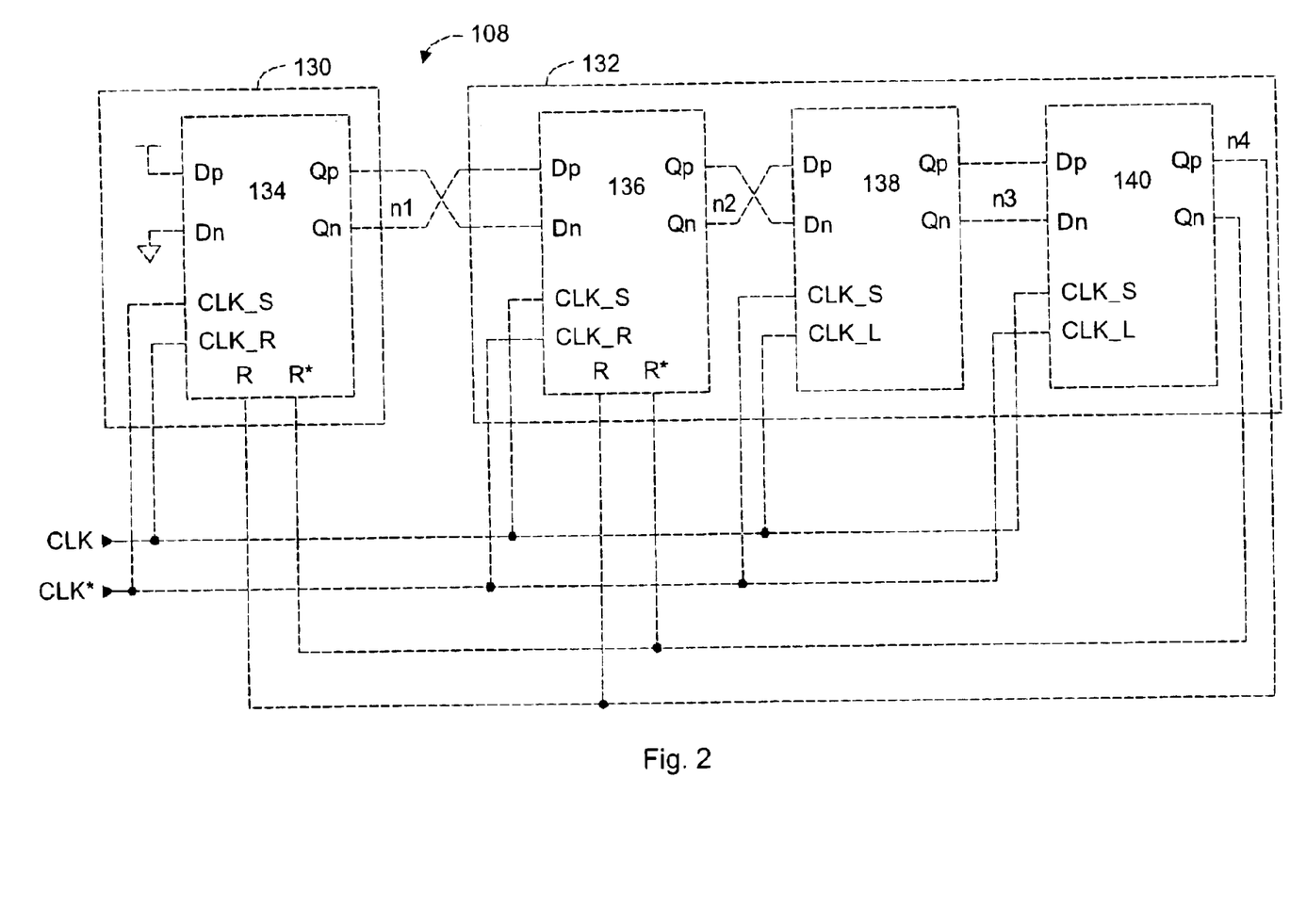
FIG. 2 shows a block diagram of the divide-by-3 circuit block shown in FIG. 1.

FIG. 2 shows a block diagram of the divide-by-3 circuit 108 of FIG. 1. This circuit provides a divided clock signal having a frequency that is three times less than the input system clock frequency, while maintaining a 50% duty cycle for the divided clock signal. In other words, the divided clock signal stays at a logic "1" level for a duration of three system clock transitions and a logic "0" level for a duration of three system clock transitions. The circuit does not require combinational logic between the flip-flops, and is simple to implement. Furthermore, the design is modular such that additional flip-flops can be added to obtain other odd numbered divided system clock frequencies without further design overhead or complexity.

The divide-by-3 circuit 108 includes a clock generator circuit 130 and a clock delay circuit 132. The clock generator circuit consists of a resettable flip-flop 134 having the supply voltage VCC connected to its Dp data input, the supply voltage VEE or ground connected to its Dn data input, the system clock signal CLK connected to its sampling clock input CLK_S, and the inverted system clock signal CLK* connected to its reset clock input CLK_R. Those of skill in the art will appreciate that a voltage differential can established between the Dp and Dn inputs with analog voltage levels instead of voltage supply voltage levels as shown in FIG. 2. Clock delay circuit 132 includes a resettable flip-flop 136, non-resettable flip-flop 138 and non-resettable flip-flop 140 connected in series. The Dp and Dn inputs of flip-flop 136 are connected to the Qn and Qp outputs of flip-flop 134 respectively, while the CLK_S and CLK_R inputs are connected to system clock signals CLK and CLK* respectively. Its R and R* inputs are connected to the Qp and Qn outputs respectively of non-resettable flip-flop 140.

The Dp and Dn inputs of flip-flop 138 are connected to the Qn and Qp outputs of flip-flop 136 respectively, while the CLK_S input and latch clock input CLK_L are connected to system clock signals CLK* and CLK respectively. The Dp and Dn inputs of flip-flop 140 are connected to the Qp and Qn outputs of flip-flop 138 respectively, while the CLK_S and CLK_L inputs are connected to system clock signals CLK and CLK* respectively. The Qp and Qn outputs of non-resettable flip-flop 140 are fed back to the reset inputs R and R* of flip-flop 134 respectively. The divided clock signal can be tapped off of either node n1 or n2 because they provide a divided clock signal with a 50% duty cycle. However, it is preferable to use n2 as the divided clock signal because it has passed through two gain stages and has less phase noise relative to node n1. This particular feature will be shown later with reference to the timing diagram of FIG. 5. Therefore, the clock generator circuit can include both resettable flip-flops 134 and 136.

All the flip-flops of FIG. 2 are data inverting flow-through flip-flops, meaning that the logic states of each Dp and Dn input, when sampled, is immediately inverted at its Qp and Qn outputs respectively. For the resettable flip-flops 134 and 136, a high logic state signal received at its CLK_S input while its R input is at the low logic state allows the flip-flop to sample its Dp and Dn inputs. Those of skill in the art will understand that R* is the inverted state of R, and CLK* is the inverted state of CLK.

It should be noted that resettable flip-flops 134 and 136 are identical flip-flop circuits, but the connections of the system clock input signals are reversed between flip-flops 134 and 136. Therefore, flip-flops 134 and 136 activate at different logic states of each CLK clock cycle. Non-resettable flip-flops 138 and 140 are identical flip-flop circuits that also have reversed system clock input signal connections between each other. Therefore flip-flops 134 and 138 activate to sample input data at one logic state of each CLK clock cycle, while flip-flops 136 and 140 activate to sample input data at the other logic state of the same CLK clock cycle.

In general operation, the clock generator circuit 130 drives node n1 to the logic "1" state, or level, in an active phase. The logic "1" state of node n1 then propagates through delay circuit 132 and appears at node n4 three system clock transitions after node n1 was driven to the logic "1" state. Node n4 at the logic "1" state switches the divide-by-3 circuit 108 to operate in a reset phase. Flip-flop 134 of clock generator circuit 130 is reset as is flip-flop 136 of delay circuit 132 to drive nodes n1 and n2 to the logic "0" state. It is noted that due to the reversed CLK and CLK* connections between flip-flops 134 and 136, n2 is driven to the logic "0" state one CLK transition after n1 is driven to the logic "0" state. The logic "0" state of n2 propagates through flip-flops 138 and 140 and appears at node n4 to switch the divide-by-3 circuit 108 to operate in the active phase three CLK transitions after n1 was driven to the logic "0" state. The clock generator circuit 130 and clock delay circuit 132 then restart as previously described. With this circuit, nodes n1 and n2 remain at the logic "0" state for three CLK transitions during the reset phase of operation.

The operation of divide by 3 circuit 108 is better understood following a description of the resettable flip-flops 134 and 136 and the non-resettable flip-flops 138 and 140. FIG. 3 is a circuit schematic of resettable flip-flops 134 and 136. The input circuit includes a pair of load devices, such as resistors 150 and 152, serially connected between VCC and the collector terminals of a pair of input transistors 154 and 156 respectively. It is noted that all the transistors shown in this schematic are n-type BJT transistors. The collector terminals of input transistors 154 and 156 are also connected to the complementary output terminals Qp and Qn respectively. The base of input transistors 154 and 156 are connected to data input terminals Dp and Dn respectively, while their emitter terminals are connected in common to the collector terminal of first mode transistor 158. A first latch circuit consisting of cross-coupled transistors 160 and 162 is coupled to output terminals Qp and Qn, and have their emitter terminals connected in common to the collector terminal of second mode transistor 164. The emitter terminals of mode transistors 158 and 164 are connected in common to the collector terminal of first clock transistor 166, while the base of transistors 158, 164 and 166 are connected to the R*, R and CLK_S input terminals respectively.

A second latch circuit consisting of cross-coupled transistors 168 and 170 is coupled to output terminals Qp and Qn, and have their emitter terminals connected in common to the collector terminal of third mode transistor 172. The reset circuit includes first reset transistor 174 having its collector connected to output terminal Qn and base connected to the VCC supply, and second reset transistor 176 having its collector connected to output terminal Qp and base connected to a voltage divider circuit. The emitter terminals of reset transistors 174 and 176 are connected in common to the collector of fourth mode transistor 178, and the emitter terminals of mode transistors 172 and 178 are connected in common to the collector of second clock transistor 180. The base of transistors 172, 178 and 180 are connected to the R*, R and CLK_R input terminals respectively. The voltage divider includes resistors 182 and 184 serially connected between VCC and ground. The emitter terminals of transistors 166 and 180 are shown connected to current source Iref of FIG. 1 for selective activation/deactivation of the circuit. Persons of skill in the art will understand that the values of resistors 150, 152, 182 and 184 can be optimized to maximize circuit performance.

Table 1 below summarizes the function of the resettable flip-flops 134 and 136 according to the logic states of the CLK and R signals.

TABLE 1

| CLK_S | CLK_R | R | R* | Function |
|---|---|---|---|---|
| 1 | 0 | 0 | 1 | Sample Dp and Dn inputs |
| 0 | 1 | 0 | 1 | Latch sampled Dp & Dn inputs |
| 0 | 1 | 1 | 0 | Reset Qn to "0" state and Qp to "1" state |
| 1 | 0 | 1 | 0 | Latch reset states |

An example of the operation of resettable flip-flops 134 and 136 now follows with reference to FIG. 3. As shown in Table 1, the input circuit of the resettable flip-flops 134 and 136 only sample data on its Dp and Dn input terminals when the R* and CLK_S input terminals receive a logic "1" voltage level, such as VCC supply voltage for example, to turn on transistors 158 and 166. Thus if input terminals Dp and Dn receive logic "1" and "0" voltage levels respectively, then Qp is driven towards the logic "0" voltage level while Qn remains at the logic "1" voltage level. When the CLK_S input terminal transitions to the logic "0" level to turn off transistor 166, the CLK_R input terminal correspondingly transitions to the logic "1" level to turn on transistor 180. Since transistor 172 is also turned on by R* at the logic "1" level, the second latch circuit latches the logic states of the Qp and Qn output terminals at the logic "0" and "1" levels respectively. When R* changes to the logic "0" level, R changes to the logic "1" level to turn on transistors 164 and 178. When the CLK_R input terminal is at the logic "1" level, the reset circuit is turned on and the output terminal Qn is driven towards the logic "0" level while Qp remains at the logic "1" level. In this particular embodiment, the reset circuit drives the preset logic states of "0" and "1" onto the Qn and Qp output terminals respectively. Those of skill in the art will appreciate that the values of resistors 182 and 184 are selected such that the voltage level of Qp is maintained at a higher voltage level than that of Qn. When the CLK_S input terminal is at the logic "1" level, transistor 164 is turned on and the first latch circuit latches the logic states of the Qp and Qn output terminals at the logic "1" and "0" levels respectively. In summary, while the R input terminal is at the logic "0" level the resettable flip-flop circuit alternately turns on the input circuit and the second latch circuit in accordance with the logic transitions of the system clock signal. Accordingly, while the R input terminal is at the logic "1" level the resettable flip-flop circuit alternately turns on the reset circuit and the first latch circuit in accordance with the logic transitions of the system clock signal.

FIG. 4 is a circuit schematic of non-resettable flip-flops 138 and 140. The non-resettable flip-flop circuit shown in FIG. 4 is similar in configuration and function to the schematic of the resettable flip-flop circuit shown in FIG. 3. The input circuit includes a pair of load resistors 190 and 192 serially connected between VCC and the collector terminals of a pair of differential input transistors 194 and 196 respectively. It is noted that all the transistors shown in this schematic are n-type BJT transistors. The collector terminals of input transistors 194 and 196 are also connected to the complementary output terminals Qp and Qn respectively. The base of input transistors 194 and 196 are connected to data input terminals Dp and Dn respectively, while their common emitter terminals are connected in common to the collector terminal of first clock transistor 198. A latch circuit consisting of cross-coupled transistors 200 and 202 is coupled to output terminals Qp and Qn, and have their emitter terminals connected in common to the collector terminal of second clock transistor 204. The emitters of clock transistors 198 and 204 are connected to current source Iref, for selective activation/deactivation as described above, while their bases are connected to the CLK_S and CLK_L terminals respectively.

The circuit of FIG. 4 functions in a similar fashion to the circuit of FIG. 3. The input circuit is turned on to sample data appearing on its Dp and Dn input terminals when the CLK_S input terminal is at the logic "1" level, and the latch circuit latches the Qp and Qn logic levels when CLK_L is at the logic "1" level. Because the reset transistors are not used in this circuit, this particular circuit does not operate in a reset phase, but will alternately sample and latch data appearing on its Dp and Dn input terminals in accordance with the logic transitions of the system clock signal.

Figure 5:
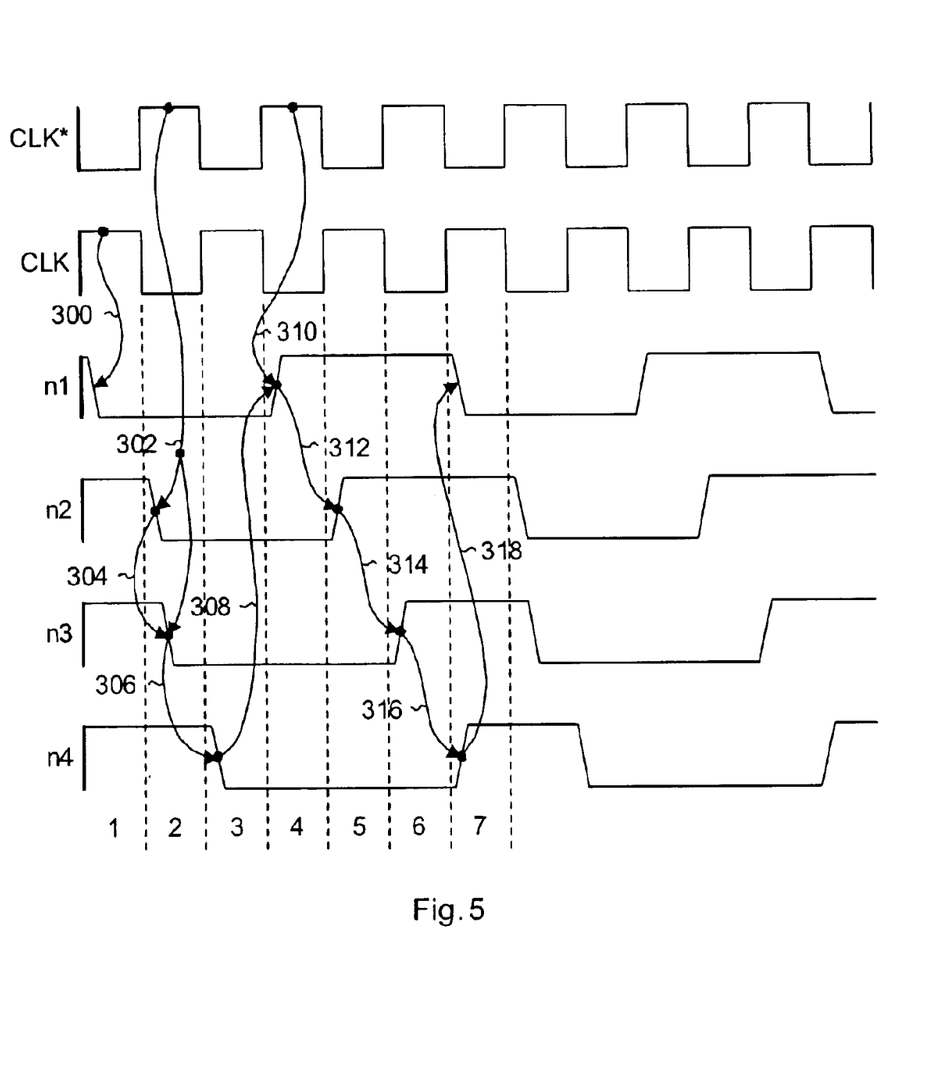

A detailed description of the operation of the divide-by-3 circuit 108 of FIG. 2 follows with reference to the timing diagram of FIG. 5. The timing diagram of FIG. 5 shows the traces for CLK, CLK*, nodes n1, n2, n3 and n4 from the block diagram of FIG. 2. The following description follows seven CLK transitions which are labelled at the bottom of the timing diagram. Transition arrows indicate the events that trigger a transition of another signal trace. It is assumed that the divide-by-3 circuit 108 starts in the reset phase of operation.

At the beginning of clock transition 1, node n1 drops to the logic "0" level, or the low logic level at first transition arrow 300 because the reset circuit of flip-flop 134 is turned on while node n4 and CLK are at the logic "1", or high logic level. As previously discussed for the circuit schematic of FIG. 3, Qp and Qn (node n1) are driven to the high and low logic levels respectively when its reset circuit is turned on.

At the beginning of clock transition 2 node n2 drops to the low logic level as indicated by second transition arrow 302, because the reset circuit of flip-flop 136 is turned on when CLK* and node n4 are at the high logic level. Note that the first latch circuit of flip-flop 134 latches its Qp and Qn logic states when CLK* is at the high logic level.

Shortly after node n2 drops to the low logic level in clock transition 2, node n3 drops to the low logic level at third transition arrow 304 because the input circuit of flip-flop 138 is turned on at the same time the reset circuit of flip-flop 136 is turned on while CLK* is at the high logic level. The short delay between n2 and n3 dropping to the low logic levels is due to the inherent delay of the input circuit transistors of flip flop 138.

At the beginning of clock transition 3 node n4 drops to the low logic level at fourth transition arrow 306 because the input circuit of flip-flop 140 is turned on while CLK is at the high logic level to sample the Qp and Qn outputs of flip-flop 138. Note that the latch circuit of flip-flop 138 latches its Qp and Qn logic states when CLK is at the high logic level in clock transition 3. Although the Qn output of flip-flop 140 is at the high logic level (complement of n4), the input circuit of flip-flop 134 does not turn on because CLK* is at the low logic level in clock transition 3. Therefore the outputs of flip-flop 134 do not change.

At the beginning of clock transition 4 node n1 rises to the high logic level because the input circuit of flip-flop 134 is turned on to sample the logic level of node n4 as indicted by fifth transition arrow 308. Sixth transition arrow 310 indicates that the input circuit is turned on when CLK* is at the high logic level. Divide-by-3 circuit 180 is now switched to the active phase of operation.

Node n2 rises to the high logic level in clock transition 5 when the input circuit of flip-flop 136 turns on to sample the logic level of node n1 when CLK is at the high logic level, as indicated by seventh transition arrow 312. Note that the Qn output of flip-flop 134 is connected to the Dp input of flip-flop 136, hence the Qn output of flip-flop 136 (node n2) has a logic level that follows its Dp input.

Node n3 rises to the high logic level in clock transition 6 when the input circuit of flip-flop 138 turns on to sample the logic level of node n2 when CLK* is at the high logic level, as indicated by eighth transition arrow 314. Note that the Qn output of flip-flop 136 is connected to the Dp input of flip-flop 138, hence the Qn output of flip-flop 138 (node n3) has a logic level that follows its Dp input.

In clock transition 7 node n4 rises to the high logic level when the input circuit of flip-flop 140 turns on to sample the logic level of node n3 when CLK is at the high logic level, as indicated by ninth transition arrow 316. Furthermore since node n4 is now at the high logic level in clock transition 7, the reset circuit of flip-flop 134 is turned on while CLK is at the high logic level as indicated by tenth transition arrow 318, causing node n1 to be driven to the low logic level. The reset phase of operation begins in clock transition 7 as it did in clock transition 1.

Looking at the signal trace for node n1, after n1 falls to the low logic level in clock transition 1, it then rises to the high logic level three clock transitions later in clock transition 4. After n1 rises the high logic level in clock transition 4, it then falls to the low logic level three clock translations later in clock transition 7. Thus node n1 alternately stays at the high logic level and the low logic level for a duration of three clock transitions.

From the timing diagram, it is apparent that the divided clock signal having one third the frequency of the system clock CLK can be obtained through nodes n1 or n2. Furthermore, the divided clock signal obtained from nodes n1 or n2 have a 50% duty cycle which is greatly desired in RF applications.

The illustrated embodiments of the present invention show that a divided clock signal having a frequency equal to the input system clock frequency divided by a factor of three can be generated. However, in alternate embodiments of the present invention, divided clock signals having a frequency equal to the input system clock frequency divided by any odd factor can be generated. To divide the input system clock by five, two additional non-resettable flip-flops can be added to the clock delay circuit 132 of divide-by-3 circuit 108 in FIG. 2. More specifically the two additional non-resettable flip-flops, each identical to flip-flop 138, are inserted between flip-flop 136 and 138. The first additional flip-flop has its Dp and Dn inputs connected to the Qn and Qp outputs respectively of flip-flop 136 and has its CLK_S and CLK_L inputs connected to CLK* and CLK respectively. The second additional flip-flop has its Dp and Dn inputs connected to the Qp and Qn outputs respectively of the first additional flip-flop and has its CLK_S and CLK_L inputs connected to CLK and CLK* respectively. The Qp and Qn outputs of the second additional flip-flop are then connected to the Dp and Dn inputs respectively of flip-flop 138. Alternatively, the two additional resettable flip-flops can be appended to flip-flop 140 instead. Therefore pairs of non-resettable flip-flops can be added to the clock delay circuit 132 to divide the input clock signal by any odd integer number.

Although the embodiments of the present invention are exemplified using BJT technology, alternate embodiments can be implemented in CMOS technology or any suitable transistor technology, and alternate load devices such as diode connected transistors for example, are appropriate substitutes for load resistors.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A frequency divider for reducing the frequency of a clock signal by an odd numbered factor n, where n is an integer value, comprising:

a clock generator circuit for receiving the clock signal and for providing an n-divided clock signal having a first and second logic level, the clock generator circuit driving the n-divided clock signal from the first logic level to the second logic level in response to a reset signal; and, a clock delay circuit for activating the reset signal at n clock transitions after receiving the first logic level of the n-divided clock signal, and for deactivating the reset signal within n clock transitions after receiving the second logic level of the divided clock signal, the clock generator circuit driving the n-divided clock signal from the second logic level to the first logic level at n clock transitions after activation of the reset signal wherein the clock generator circuit includes a first resettable flip-flop having a data input connected to a supply voltage and the clock delay circuit includes a reset input for receiving the reset signal and a second resettable flip-flop having a data input for receiving the divided clock signal and a reset input for receiving the reset signal, the second resettable flip-flop providing a delayed n-divided clock signal, and at least one pair of serially connected non-resettable flip-flops receiving the delayed n-divided clock signal from the second resettable flip-flop for activating and deactivating the reset signal.

2. The frequency divider of claim 1, wherein the first resettable flip-flop and the first non-resettable flip-flop of each pair of non-resettable flip-flops receive the clock signal, and the second resettable flip-flop and the second non-resettable flip-flop of each pair of non-resettable flip-flops receive an inverted clock signal.

3. The frequency divider of claim 2, wherein an output of the at least one serially connected pair of non-resettable flip-flops are connected to the reset inputs of the first and second resettable flip-flops.

4. The frequency divider of claim 3, wherein the first resettable flip-flop, the second resettable flip-flop, and the pair of non-resettable flip-flops are data inverting flow through flip-flops.

5. The frequency divider of claim 2, wherein each resettable flip-flop includes an input circuit receiving a pair of input signals in response to a first transition of the clock signal for inverting a logic level of the input signals at complementary output terminals during an active phase of operation;

an input latch circuit for latching the logic states of the complementary output terminals in response to a second transition of the clock signal during the active phase of operation;

a reset circuit for driving the complementary output terminals to preset logic states in response to the second transition of the clock signal during a reset phase of operation; and, a reset latch circuit for latching the preset logic states of the complementary output terminals in response to the first transition of the clock signal during the reset phase of operation.

6. The frequency divider of claim 1, wherein the n clock transitions include transitions in both positive and negative directions.

7. A frequency divider for reducing the frequency of a clock signal by a factor of three, comprising:

a clock generator circuit having a data input for receiving a supply voltage, a clock input for receiving the clock signal and a reset input for receiving a reset signal, for providing a divide-by-3 clock signal having a first and second logic level from an output terminal, the clock generator circuit driving the divide-by-3 clock signal from the first logic level to the second logic level in response to the reset signal;

first, second and third serially connected clock delay flip-flops each receiving the clock signal for receiving the divide-by-3 clock signal and for activating the reset signal at three clock transitions after receiving the first logic level of the divide-by-3 clock signal, and for deactivating the reset signal within three clock transitions after receiving the second logic level of the divide-by-3 clock signal, the clock generator circuit driving the divide-by-3 clock signal from the second logic level to the first logic level at three clock transitions after activation of the reset signal.

8. The frequency divider of claim 7, wherein the clock generator circuit includes a resettable flip-flop.

9. The frequency divider of claim 8, wherein the first clock delay flip-flop is a resettable flip-flop having a reset input.

10. The frequency divider of claim 9, wherein the second and third clock delay flip-flops are non-resettable flip-flops.

11. The frequency divider of claim 10, wherein the clock generator circuit and the second clock delay flip-flop receives the clock signal, and the first clock delay flip-flop and the third clock delay flip-flop receives an inverted clock signal.

12. The frequency divider of claim 11, wherein an output of the third clock delay flip-flop is connected to the reset inputs of the clock generator circuit and the first clock delay flip-flop.

13. The frequency divider of claim 8, wherein the clock generator circuit, the first, second and third clock delay flip-flops are data inverting flow through flip-flops.

* * * * *